(12) United States Patent
Neema et al.

(10) Patent No.: US 12,422,474 B2
(45) Date of Patent: Sep. 23, 2025

(54) FORCE/MEASURE CURRENT GAIN TRIMMING

(71) Applicant: TEXAS INSTRUMENTS INCORPORATED, Dallas, TX (US)

(72) Inventors: Tanmay Neema, Bangalore (IN); Kanak Das, Bangalore (IN); Rajavelu Thinakaran, Bangalore (IN); Gautam Nandi, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 175 days.

(21) Appl. No.: 18/478,038

(22) Filed: Sep. 29, 2023

(65) Prior Publication Data
US 2024/0337686 A1  Oct. 10, 2024

(30) Foreign Application Priority Data
Apr. 5, 2023  (IN) .............................. 202341025721

(51) Int. Cl.
*G01R 31/28* (2006.01)
*H03F 3/45* (2006.01)
*H03M 1/66* (2006.01)

(52) U.S. Cl.
CPC ..... *G01R 31/2879* (2013.01); *G01R 31/2889* (2013.01); *H03F 3/45475* (2013.01); *H03M 1/662* (2013.01); *H03F 2200/261* (2013.01)

(58) Field of Classification Search
CPC .............................................. G01R 31/31924
See application file for complete search history.

(56) References Cited

U.S. PATENT DOCUMENTS

| | | | |
|---|---|---|---|
| 11,522,554 B2 * | 12/2022 | Zhang ................... | H03M 3/356 |
| 2008/0061872 A1 * | 3/2008 | Hughes ............... | H03F 3/45475 |
| | | | 330/86 |

* cited by examiner

*Primary Examiner* — Tung X Nguyen
(74) *Attorney, Agent, or Firm* — Mandy Barsilai Fernandez; Frank D. Cimino

(57) ABSTRACT

The techniques and circuits, described herein, include solutions for error compensation in source measurement units (SMUs). An example SMU is capable of both sourcing current to a device under test (DUT) and measuring current through the DUT. An SMU may include a sensing resistor coupled in series with the DUT. A voltage across the sensing resistor may be measured by a current sensing amplifier in order to determine the output current through the DUT. In practice, the resistance of the sensing resistor may vary depending on manufacturing tolerances, etc. A gain of the current sensing amplifier may be calibrated in order to compensate for sensing resistor variance, which increases the accuracy with which current to the DUT can be sourced and measured.

20 Claims, 12 Drawing Sheets

510

| $D_{in}$ | CALCULATED OUTPUT | $D_{mod}$ |
|---|---|---|
| 0 | 0 | 0 |
| 1 | 0.74 | 1 |
| 2 | 1.48 | 1 |
| 3 | 2.22 | 2 |
| 4 | 2.96 | 3 |
| 5 | 3.7 | 4 |
| 6 | 4.44 | 4 |
| 7 | 5.18 | 5 |
| 8 | 5.92 | 6 |

520

| $D_{in}$ | CALCULATED OUTPUT | $D_{mod}$ |
|---|---|---|
| 0 | 0 | 0 |
| 1 | 5.92 | 6 |
| 2 | 11.84 | 12 |
| 3 | 17.76 | 18 |
| 4 | 23.68 | 24 |
| 5 | 29.6 | 30 |
| 6 | 35.52 | 36 |
| 7 | 41.44 | 41 |

FIG. 5

FORCE/MEASURE CURRENT GAIN TRIMMING

CROSS-REFERENCE TO RELATED APPLICATION

This application claims the benefit of India Provisional Application No. 202341025721, filed on Apr. 5, 2023, the contents of which are hereby incorporated by reference in their entirety.

BACKGROUND

A source measurement unit (SMU) is a device that combines a sourcing function and a measurement function on a same pin or connector. The SMU can source voltage or current to the pin while simultaneously measuring a voltage on the pin or current through the pin. By simultaneously utilizing the sourcing function and the measuring function, the SMU can be used to test electronic devices under specific conditions and verify correct functionality.

SUMMARY

In one example, a circuit includes a force amplifier, a resistor array, a digital to analog converter (DAC), a current sensing amplifier, and a gain selection circuit. The force amplifier has a first input, a second input, and an output. The resistor array has a first terminal coupled to the output of the force amplifier, a second terminal, and a control terminal. The DAC has a first input, an output coupled to the first input of the force amplifier, and a gain selection input. The current sensing amplifier has a first input coupled to the first terminal of the resistor array, a second input coupled to the second terminal of the resistor array, an output coupled to the second input of the force amplifier, and a gain selection input. The gain selection circuit has a control terminal coupled to the control terminal of the resistor array, and an output coupled to the gain selection input of the current sensing amplifier.

In another example, a circuit includes a force amplifier, a resistor array, a current sensing amplifier, and a gain selection circuit. The force amplifier has a first input, a second input, and an output. The resistor array has a first terminal coupled to the output of the force amplifier, a second terminal, and a control terminal. The current sensing amplifier has a first input coupled to the first terminal of the resistor array, a input coupled to the second terminal of the resistor array, an output coupled to the input of the force amplifier, and a gain selection input. The gain selection circuit has a control terminal coupled to the control terminal of the resistor array, and an output coupled to the gain selection input of the current sensing amplifier.

In another example, a circuit includes a force amplifier, a sensing resistor, a digital to analog converter (DAC), and a current sensing amplifier. The force amplifier has a first input, a second input, and an output. The sensing resistor has a first terminal coupled to the output of the force amplifier, and a second terminal. The DAC has a first input, a gain selection input, and an output coupled to the first input of the force amplifier. The current sensing amplifier has a first input coupled to the first terminal of the sensing resistor, a second input coupled to the second terminal of the sensing resistor, an output coupled to the second input of the force amplifier, and a gain selection input. The current sensing amplifier is configured to adjust a gain of the current sensing amplifier responsive to a first gain selection signal received on the gain selection input of the current sensing amplifier. Furthermore, the DAC is configured to adjust a gain of the DAC responsive to a second gain selection signal received on the gain selection input of the DAC.

BRIEF DESCRIPTION OF THE DRAWINGS

FIG. 5 is an example table diagram illustrating DAC non-linearity.

FIG. 7 is an example flow diagram for calibrating a gain of a.

DETAILED DESCRIPTION

The drawings are not drawn to scale.

A source measurement unit (SMU), which may also be referred to as a parametric measurement unit (PMU), is a type of electronic instrument used to precisely source and measure electronic signals. SMUs can source or provide a controlled voltage or current at an output, while measuring a voltage and/or current at the output. An example SMU can provide both positive and negative voltages at the output, and provide both current sourcing and sinking current at the output. By providing a controlled voltage/current and measuring the current/voltage response, the SMU can "test" a device connected to the output, referred to as a device under test ("DUT"). Based on the measured response, the current-voltage (IV) characteristics of the device can be characterized. The IV characteristics can indicate properties of the device (e.g., a threshold voltage) and verify that the device is functioning as expected. One or more SMUs may be implemented in a tester, such as an automatic test equipment (ATE), memory tester, or another suitable type of tester.

Figure 1:
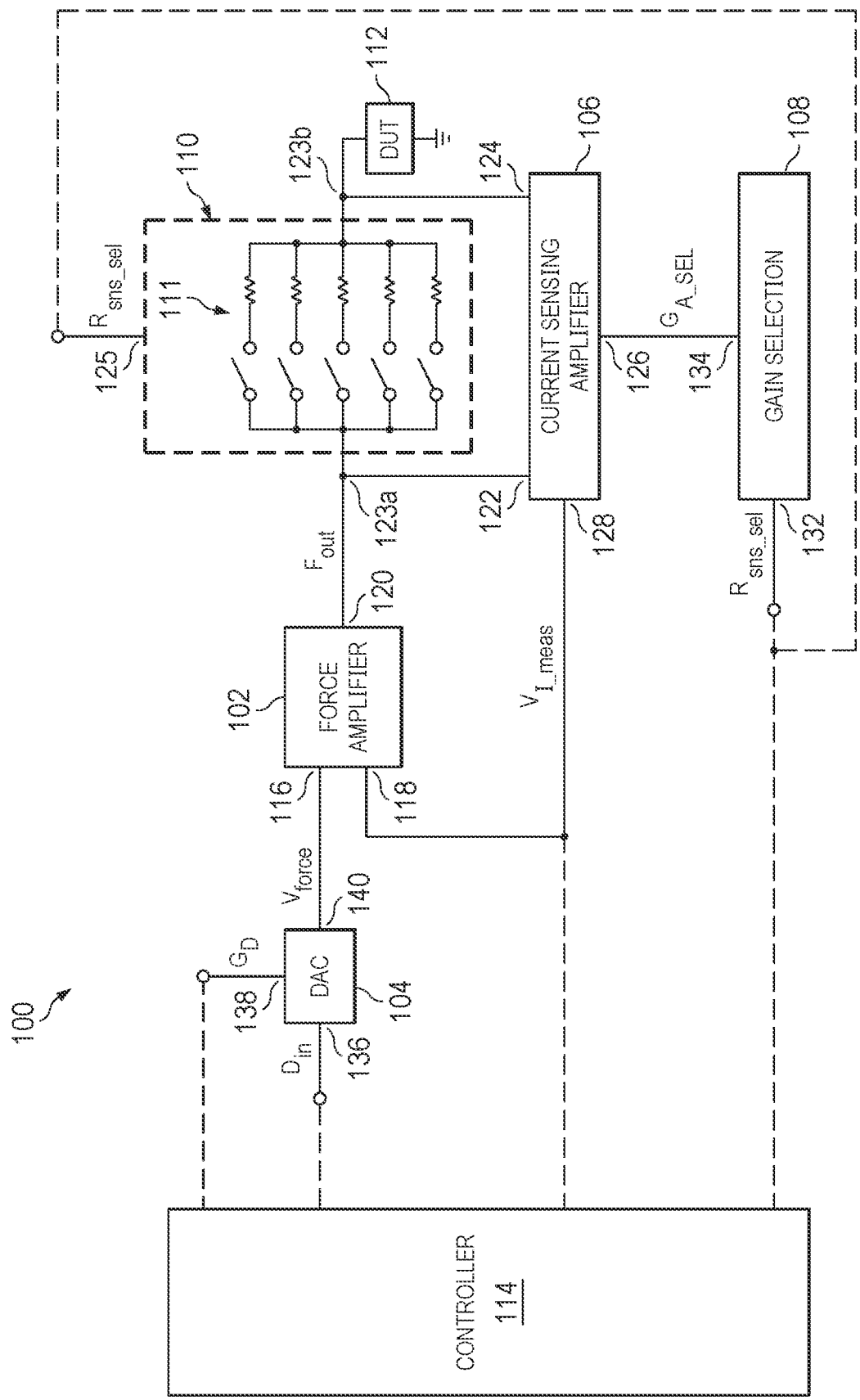
FIG. 1 is a circuit schematic illustrating an example source measurement unit (SMU) including digital and analog gain selection circuitry.

FIG. 1 illustrates an example of an SMU 100. As shown, the SMU includes a force amplifier 102, a DAC 104, a current sensing amplifier 106, a gain selection circuit 108, and a resistor array 110. Further illustrated in FIG. 1 is a device under test (DUT) 112 and a controller 114.

The force amplifier has a (first) input 116, a (second) input 118, and an output 120. The resistor array 110 includes one or more resistors 111, and has a (first) terminal 123a coupled to the output 120, a (second) terminal 123b, and a control terminal 125. The current sensing amplifier 106 has a (first) input 122 coupled to the terminal 123a, a (second) input 124 coupled to the terminal 123b, a gain selection input 126, and an output 128 coupled to the input 118 of the force amplifier. The DAC 104 has a first input 136 and a gain selection input 138, which may be coupled to the controller 114 as shown.

Furthermore, the DAC 104 has an output 140, which is coupled to the input 116 of the force amplifier 102. The gain selection circuit 108 has a control terminal 132 and an output 134. The control terminal 132 is coupled to the control terminal 125 of the resistor array 110, which may be coupled to the controller 114 as shown.

In some examples, the SMU 100 is configured to "test" the DUT 112 by providing a controlled voltage/current to the DUT 112 and measuring the current/voltage response. During testing, the DUT 112 may be coupled to the SMU 100 via terminals or pins. As shown, the DUT 112 has a first terminal coupled to the terminal 123b and a second terminal coupled to a ground terminal at electrical ground. The DUT 112 includes, for example, a wafer, a die, a chip, a battery, a photovoltaic cell, or another suitable type of device.

When testing the DUT 112, the SMU 100 may utilize a sourcing function and a measuring function. In some examples, the controller 114 controls the sourcing and measuring functions by providing various control signals such as $R_{sns\_sel}$ and $D_{in}$. Although not illustrated for simplicity, the controller 114 may also be coupled/connected to various components of the SMU 100 (e.g., the force amplifier 102, the current sensing amplifier 106, etc.) to control the various components via control signals according to the functionality described herein.

In an example sourcing function, the SMU 100 operates in a force voltage mode or a force current mode. In the force voltage mode, the SMU 100 provides a constant voltage to the DUT 112. In the force current mode, the SMU 100 provides a constant current to the DUT 112. As used herein, the term "constant" shall refer to a voltage or a current that varies by less than approximately +−0.1% from a particular value. However, in alternative examples, a more precise variance may be used (e.g., +−½$^{18}$%).

In the force current mode, the force amplifier 102 provides a signal $F_{out}$ at the output 120 responsive to signals (e.g., voltages) $V_{force}$ and $V_{I\_meas}$ received on the inputs 116, 118 respectively. The signal $V_{force}$ is provided by the DAC 104, and the signal $V_{I\_meas}$ is provided by the current sensing amplifier. In some examples, the signal $F_{out}$ is a constant current signal in the force current mode. The constant current flows through the resistor array 110 and through the DUT 112. In an example, the current sensing amplifier 106 draws little to no current on the inputs 122, 124. Thus, the current through the resistor array 110 is approximately equal to the current through the DUT 112.

In some examples, the force amplifier 102 provides $F_{out}$ based on and responsive to a difference between $V_{force}$ and $V_{I\_meas}$. The current sensing amplifier 106 measures a voltage across the resistor array 110, which is proportional to the current through the DUT 112. Responsive to the measured voltage across the resistor array 110, the current sensing amplifier 106 provides the signal $V_{I\_meas}$ to the input 118 of the force amplifier 102. For example, the voltage $V_{I\_meas}$ may be equal to the measured voltage, or proportional to the measured voltage according to a gain of the current sensing amplifier 106. The force amplifier 102 may increase/decrease the current at the output 120 accordingly responsive to the feedback from the signal $V_{I\_meas}$, for example, until the voltage $V_{I\_meas}$ is equal to $V_{force}$.

In an example, the controller 114 controls the current through the DUT 112 by adjusting the signals $R_{sns\_sel}$ and $D_{in}$. For instance, the SMU 100 operates in one or more current ranges, e.g., +−5 uA, +−40 uA, +−200 uA, +−2 mA, +−100 mA, etc. The controller 114 selects a current range from the one or more current ranges using the signal $R_{sns\_sel}$, and selects a current within the current range using the signal $D_{in}$. For example, the signal $R_{sns\_sel}$ is a control signal provided to the control terminal 125 of the resistor array 110 used to select a particular resistance value. Each resistor of the one or more resistors 111 may have a different resistance value corresponding to each of the one or more current ranges respectively. Responsive to the signal $R_{sns\_sel}$, the resistor array 110 couples the appropriate resistor (e.g., from the resistors 111) for the current range and decouples the remaining resistors, for example, using one or more switches as shown. The signal $D_{in}$ may be a digital signal that is converted by the DAC 104 to produce the signal $V_{force}$. In some examples, the signal $V_{force}$ ranges between +−5 Volts (V). By changing the resistance of the resistor array 110 using $R_{sns\_sel}$, the scaling of the feedback through the current sensing amplifier is modified. This way, the entire range (e.g., +−5V) of $V_{force}$ can be utilized within a given current range. Also, a proportionally similar accuracy tolerance can be maintained for force current regardless of what current range the SMU 100 is currently operating in.

In an example measuring function, the SMU 100 measures the voltage across the DUT 112 or the current through the DUT 112. When measuring the current through the DUT 112, the controller 114 determines the measured current responsive to the voltage $V_{I\_meas}$, since $V_{I\_meas}$ is proportional to the current through the DUT 112.

The controller 114 may utilize a set of expected or "known" resistance values of the resistors 111 (e.g., for calculations) when forcing or measuring current. For example, when forcing current, the controller 114 calculates the appropriate value for $D_{in}$ based on a known resistance of the active resistor for the current range. Similarly, when measuring current, the controller 114 may calculate the current through the DUT 112 based on the voltage $V_{I\_meas}$ and the known resistance. In practice, the actual resistances of the resistors 111 can vary from the expected resistances of the resistors 111 due to manufacturing constraints, parasitic elements, etc. The resistor variance, in combination with other factors, can negatively impact force/measure current accuracy by affecting the voltage measured by the current sensing amplifier. Some other techniques to compensate for resistor variance in the force/measure current path have several drawbacks, including large area penalty on the chip, differential non-linearity degradation, and increased circuit complexity. The present description provides techniques and circuitry for compensating for such resistor variance while, for example, maintaining an area efficient chip design and a linear response.

As described herein, the force current path may include the DAC 104, the force amplifier 102, the resistor array 110, and the current sensing amplifier 106. The measure current path may include the force amplifier 102, the resistor array 110, and the current sensing amplifier 106.

In order to compensate for the errors introduced in the force/measure current path by variance in the resistors 111, the SMU 100 further includes the gain selection circuit 108 having the control terminal 132 and the output 134. The control terminal 132 is coupled to the control terminal 125 of the resistor array 110 and receives the signal $R_{sns\_sel}$. A gain selection signal $G_{A\_SEL}$ is provided at the output 134, which is coupled to a gain selection input 126 of the current sensing amplifier 106.

In some examples, the current sensing amplifier 106 adjusts its gain responsive to the signal $G_{A\_SEL}$. For example, the current sensing amplifier 106 has one or more potential gain settings, and the current sensing amplifier 106 selects a gain setting from the one or more gain settings responsive to the signal $G_{A\_SEL}$. The number of potential gain settings may vary depending on the desired force/measure current accuracy. A greater number of potential gain settings may be used to achieve greater force/measure current accuracy by allowing for finer adjustment of the current sensing amplifier gain.

In some examples, the one or more gain settings are distributed according to a geometric progression. For example, the nth gain setting $\text{Gain}_N$ is defined by the equation $\text{Gain}_N = \text{Gain}_{min} * r^N$, where $\text{Gain}_{min}$ is the minimum gain of the one or more gain settings, and r is a progression factor. The progression factor may be defined by the equation $$r = \left(\frac{\text{Gain}_{max}}{\text{Gain}_{min}}\right)^{\frac{1}{N}},$$

where $\text{Gain}_{max}$ is the maximum gain of the one or more gain settings.

By adjusting the gain of the current sensing amplifier 106 using the signal $G_{A\_SEL}$ the force/measure current accuracy can be improved by compensating for variance in the resistors 111. For example, the gain of the current sensing amplifier 106 can be increased to compensate for a smaller than expected resistance (e.g., of the resistors 111). Similarly, the gain of the current sensing amplifier 106 can be decreased to compensate for a greater than expected resistance value. As a result, $V_{I\_meas}$ accurately reflects the current through the DUT 112, even in the presence of resistor variance, which improves both force current and measure current accuracy.

In some examples, the gain selection circuit 108 provides the signal $G_{A\_SEL}$ responsive to the signal $R_{sns\_sel}$. For example, the gain selection circuit 108 includes a memory storing one or more $G_{A\_SEL}$ values corresponding to one or more $R_{sns\_sel}$ values respectively, which can be determined and stored during manufacturing/calibration of the SMU 100. A different value of $G_{A\_SEL}$ may be provided depending on the selected current range (e.g., depending on $R_{sns\_sel}$). Each current range may utilize a different resistor of the resistors 111, as previously described. Each resistor of the resistors 111 may have a different variance, thus, the optimal value of $G_{A\_SEL}$ may be different for each resistor.

As an example, the resistors 111 can include a first resistor having an expected resistance of 200 kiloohms, and a second resistor having an expected resistance of 5 kiloohms. However, due to manufacturing process variation, the first resistor has an actual resistance of 190 kiloohms, and the second resistor has an actual resistance of 5.5 kiloohms. An optimal value of $G_{A\_SEL}$ for a given resistor may cause the current sensing amplifier 106 to modify its gain according to a gain factor determined by a ratio of the expected resistance to the actual resistance. For example, when the first resistor is selected, a first value of $G_{A\_SEL}$ can be provided. The first value of $G_{A\_SEL}$ adjusts the gain of the current sensing amplifier 106 by a factor of ~1.05 (e.g., 200/190). Similarly, when the second resistor is selected, a second value of $G_{A\_SEL}$ can be provided, which may differ from the first value of $G_{A\_SEL}$ due to different variance in the first and second resistors. The second value of $G_{A\_SEL}$ adjusts the gain of the current sensing amplifier 106 by a factor of ~0.91 (e.g., 5/5.5).

The force/measure current path error can be compensated for all current ranges using the variable gain of the current sensing amplifier 106 by using different values of $G_{A\_SEL}$. The area on the chip occupied by the variable gain circuitry of the current sensing amplifier 106 is substantially the same, regardless of how many current ranges (e.g., resistors 111) the SMU 100 is configured for. As a result, the number of resistors 111 and/or the resistance values of the resistors 111 can be changed flexibly, without impacting the effectiveness of the error compensation and with negligible area penalty on the chip.

In some examples, the signal $G_{A\_SEL}$ is a 3-bit digital signal that corresponds to 8 possible gain settings of the current sensing amplifier 106. In order to further increase the error compensation accuracy, more gain settings can be added to the current sensing amplifier 106. However, adding gain settings increases both the circuitry complexity as well as the required area on the chip. When considering high levels of force/measure current accuracy, error correction strictly using the variable gain of the current sensing amplifier 106 may be suboptimal.

Accordingly, the SMU 100 further includes the DAC 104 having the gain selection input 138. The DAC 104 receives a gain selection signal $G_D$ on the gain selection input 138, for example, from the controller 114. The signal $G_D$ may be used to adjust the signal $D_{in}$ to perform further error compensation after the error compensation by the current sensing amplifier 106. Responsive to $G_D$, the DAC 104 may adjust a gain applied to the signal $D_{in}$. The gain may be adjusted to compensate for errors in the force current path due to variance in the resistors 111. The controller 114 may perform a similar process to compensate for errors in the measure current path due to variance in the resistors 111. For example, the controller 114 adjusts a digital gain applied to the signal $V_{I\_meas}$ after performing analog to digital conversion on the signal $V_{I\_meas}$.

In some examples, the current sensing amplifier 106 provides a first "coarse" error correction in the analog domain responsive to the signal $G_{A\_SEL}$, and the DAC 104 provides a second "fine" error correction in the digital domain responsive to the signal $G_D$. For instance, the coarse error correction reduces a variation at the output of the SMU 100 (e.g., to the DUT 112) from ~26% to ~4%, and the fine error correction further reduces the 4% variation to 1 least significant bit (LSB) accuracy at 18 bit resolution. Performing error correction in the analog domain or the digital domain alone may have several drawbacks. For example, in order to achieve higher levels of precision, correction strictly in the analog domain may utilize increasingly complex circuitry. Whereas, correction strictly in the digital domain may have an increasing penalty to differential non-linearity. Using a combination of analog error correction and digital error correction, both circuit complexity and differential non-linearity can be minimized.

Firstly, a coarse analog error correction is performed. By using the analog circuitry for coarse error correction, the circuit complexity remains relatively low. Subsequently, a fine digital error correction is performed, which further increases the force/measure current accuracy. The negative effects (e.g., differential non-linearity) that may result from large amounts of digital error correction are reduced, since only fine error correction is performed in the digital domain. In addition, some further error correction may be desired due to other variables such as reference voltages used by the SMU 100, operating conditions, etc. The controller 114 may make further adjustments as needed using digital error correction via the signal $G_D$.

In some examples, the force amplifier 102, the DAC 104, the current sensing amplifier 106, the gain selection circuit 108, and the resistor array 110 are on a same semiconductor substrate or integrated circuit (IC) "chip", and the DUT 112 is external to the chip. For instance, the DUT 112 is coupled to the chip via terminals or pins. Furthermore, the controller 114 may be on the chip, or external to the chip.

Figure 2:
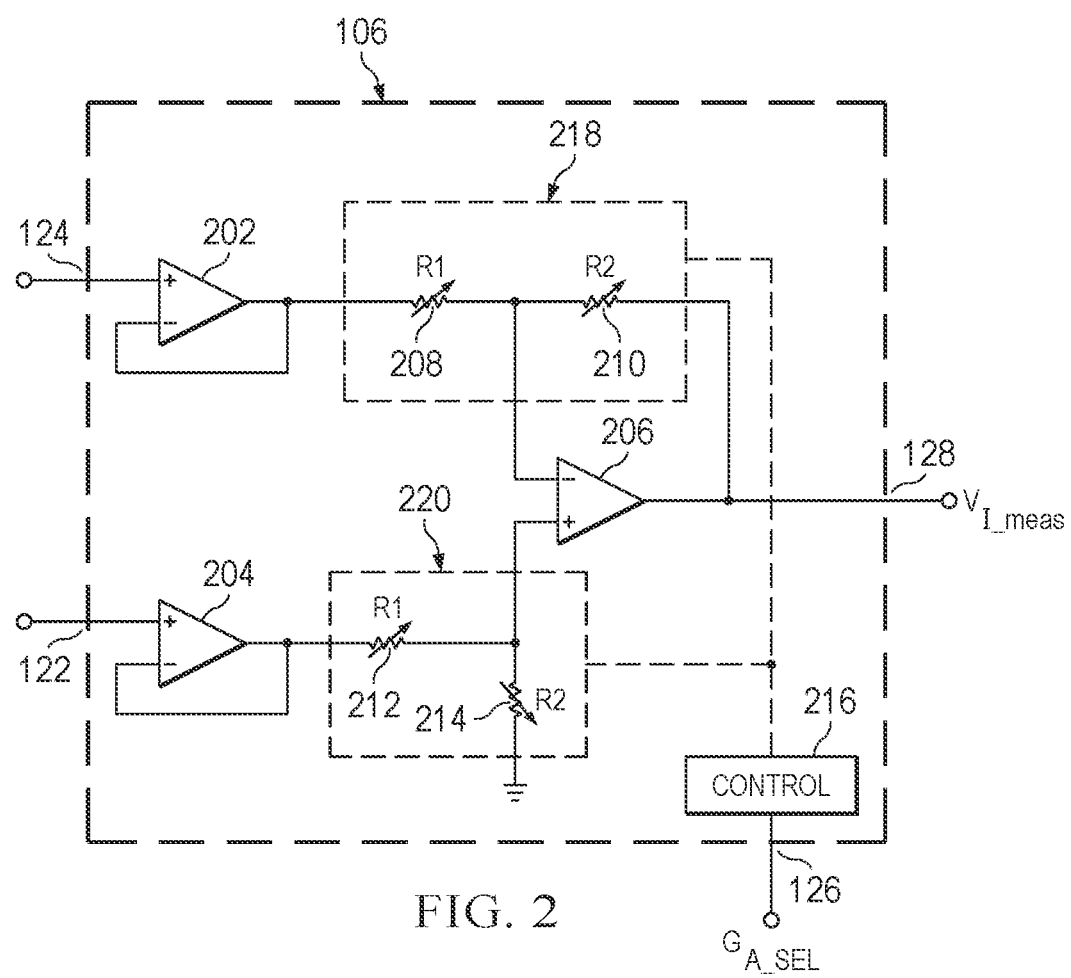
FIG. 2 is a circuit schematic illustrating an example current sensing amplifier having a gain selection input.

FIG. 2 illustrates an example of the current sensing amplifier 106 of FIG. 1. Similar to FIG. 1, the current sensing amplifier 106 has the inputs 122, 124, the gain selection input 126, and the output 128.

As shown, the current sensing amplifier 106 includes a (first) amplifier 202, a (second) amplifier 204, a (third) amplifier 206, a (first) variable resistance network 218 represented by a (first) resistor 208 and a (second) resistor 210, a (second) variable resistance network 220 represented by a (third) resistor 212 and a (fourth) resistor 214, and a control circuit 216. Any one or more of the represented resistors 208, 210, 212, 214, can have a variable or adjustable resistance. The amplifier 202 has a first input coupled to the input 124, a second input, and an output coupled to the second input. The amplifier 204 has a first input coupled to the input 122, a second input, and an output coupled to the second input. The amplifier 206 has a first input, a second input, and an output coupled to the output 128.

The resistor 208 has a first terminal coupled to the output of the amplifier 202, and a second terminal coupled to second input of the amplifier 206. The resistor 210 has a first terminal coupled to the second terminal of the resistor 208, and a second terminal coupled to the output 128. The resistor 212 has a first terminal coupled to the output of the amplifier 204, and a second terminal coupled to the first input of the amplifier 206. The resistor 214 has a first terminal coupled to the second terminal of the resistor 212, and a second terminal coupled to ground. The resistors 208, 212 have a first resistance "R1" and the resistors 210, 214 have a second resistance "R2". A gain of the current sensing amplifier is a function of a ratio R2/R1.

The control circuit 216 has a control input coupled to the gain selection input 126 of the current sensing amplifier 106, and an output coupled to the variable resistance network 218 and the variable resistance network 220. In an example, the control circuit 216 controls the variable resistance networks 218, 220 responsive to the signal $G_{A\_SEL}$. By controlling the variable resistance networks 218, 220, the resistances R1 and/or R2 are adjusted in order to adjust a gain of the current sensing amplifier 106. The values of R1 and R2 may be adjusted by controlling (e.g., opening/closing) one or more switches (not shown) of the variable resistance networks 218, 220, or otherwise adjusting the resistance values associated with the variable resistance networks 218, 220. In the example of FIG. 2, the control circuit 216 is illustrated as having a single output coupled to both the variable resistance network 218 and the variable resistance network 220. In alternative examples the control circuit 216 has separate outputs coupled to the variable resistance networks 218, 220 respectively.

Figure 3:
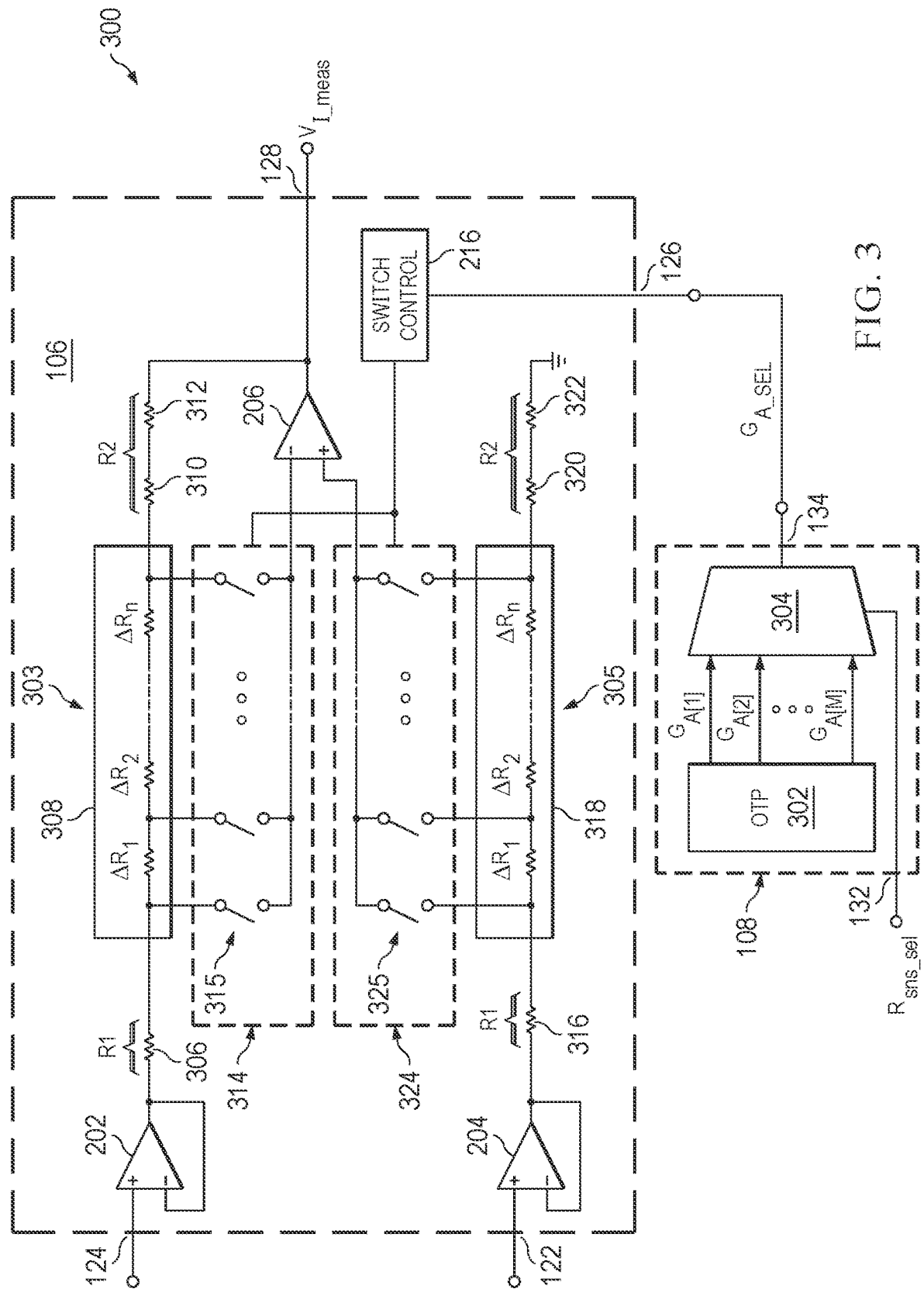
FIG. 3 is a circuit schematic illustrating an example of a current sensing amplifier coupled to a gain selection circuit.

FIG. 3 illustrates an example circuit 300 including the current sensing amplifier 106 and the gain selection circuit 108. Similar to FIG. 2, the current sensing amplifier 106 includes the amplifiers 202, 204, 206, the control circuit 216, a (first) plurality of resistors 303, a (second) plurality of resistors 305, which are operably coupled as shown. The circuit 300 further includes a (first) switching network 314, and a (second) switching network 324. The plurality of resistors 303 includes a (first) resistor 306, a (second) resistor 310, a (third) resistor 312, and a (third) plurality of resistors 308. The plurality of resistors 305 includes a (fourth) resistor 316, a (fifth) resistor 320, a (sixth) resistor 322, and a (fourth) plurality of resistors 318.

In an example, the plurality of resistors 303 and the switching network 314 represent the variable resistance network 218 of FIG. 2. Also, the plurality of resistors 305 and the switching network 324 represent the variable resistance network 220 of FIG. 2. Also, the control circuit 216 is referred to as a switch control circuit 216 by reference to FIG. 3, since it is used to control closing (conducting) and opening (non-conducting) of switches in the switching networks 314 and 324. A closed and conducting switch is referred to as being "ON." An open and non-conducting switch is referred to as being "OFF."

The gain selection circuit 108 includes a one-time programmable memory (OTP) and a multiplexer 304. The OTP 302 has a plurality of outputs coupled to a plurality of inputs of the multiplexer 304. The multiplexer further has a selection input coupled to the control terminal of the gain selection circuit 108. As shown, the OTP 302 may be programmed with a plurality of values $G_{A[1]}$, $G_{A[2]}$, . . . , $G_{A[M]}$, also referred to as gain values. Responsive to the signal $R_{sns\_sel}$, a value of the plurality of values may multiplexed from (selected by) the OTP 302 by the multiplexer 304 and provided as the signal $G_{A\_SEL}$ at the output 134. The plurality of values $G_{A[1]}$, $G_{A[2]}$, . . . , $G_{A[M]}$ may be calibrated to provide the appropriate error correction when operating in a plurality of respective current ranges. Further details of programming the OTP 302 are described, for example, with reference to FIG. 6.

The plurality of resistors 303 are coupled in series between the output of the amplifier 202 and the output of the amplifier 206. The plurality of resistors 305 are coupled in series between the output of the amplifier 204 and a ground terminal.

The resistor 306 has a first terminal coupled to the output of the amplifier 202, and a second terminal coupled to a first end of the plurality of resistors 308. The resistor 310 has a first terminal coupled to a second end of the plurality of resistors 308, and a second terminal. The resistor 312 has a first terminal coupled to the second terminal of the resistor 310, and a second terminal coupled to the output 128.

The resistor 316 has a first terminal coupled to the output of the amplifier 204, and a second terminal coupled to a first end of the plurality of resistors 318. The resistor 320 has a first terminal coupled to a second end of the plurality of resistors 318, and a second terminal. The resistor 322 has a first terminal coupled to the second terminal of the resistor 320, and a second terminal coupled to ground.

The switching network 314 has a plurality of inputs coupled to the plurality of resistors 308, an output coupled to the second input of the amplifier 206, and a control input coupled to an output of the switch control circuit 216. The switching network 314 includes a plurality of switches 315 having a plurality of respective first terminals and second terminals. The first terminals of the plurality of switches 315 are coupled to the plurality of inputs of the switching network 314, and the second terminals of the plurality of switches 315 are coupled to the output of the switching network 314.

The switching network 324 has a plurality of inputs coupled to the plurality of resistors 318, an output coupled to the first input of the amplifier 206, and a control input coupled to the output of the switch control circuit 216. The switching network 324 includes a plurality of switches 325 having a plurality of respective first terminals and second terminals. The first terminals of the plurality of switches 325 are coupled to the plurality of inputs of the switching network 324, and the second terminals of the plurality of switches 325 are coupled to the output of the switching network 324.

The switches of the switching networks 314 and 324 may be implemented as field effect transistors (FETs) (e.g., metal-oxide-semiconductor FETs (MOSFETS)), bipolar junction transistors (BJTs), or the like.

In an example, the switch control circuit 216 is configured to open/close the plurality of switches 315, 325 of the switching networks 314, 324 respectively responsive to the signal $G_{A\_SEL}$ received on the gain selection input 126. For example, responsive to $G_{A\_SEL}$, the switch control circuit 216 closes a single switch of the plurality of switches of the switching network 314 and opens the remaining switches. Each of the plurality of resistors 308 and/or 318 has a resistance denoted by $\Delta R_1, \Delta R_2, \ldots, \Delta R_n$. By closing the single switch, a connection is created between the plurality of resistors 308 and the second input of the amplifier 206. For the purpose of analysis, the sum of the resistance of the resistors to the left of the closed switch can be considered as R1, and the sum of the resistance of the resistors to the right of the closed switch can be considered as R2 (e.g., as in FIG. 2). Depending on which switch of the switching network 314 is closed, the values of R1 and R2 can be adjusted, which adjusts the gain of the current sensing amplifier 106 by adjusting the ratio R2/R1. A similar methodology can be applied using the switching network 324 to adjust R1 and R2 in the lower branch of the circuit.

The switches 315, 325 are coupled to the inputs of the amplifier 206, which draw little to no current, in an example. Therefore, the size of the switches 315, 325 can be minimized, since conductive losses are of relatively low concern.

A voltage used to drive the gates of the switches 315, 325 may be limited to a supply ("rail") voltage Vdd. Furthermore, in certain scenarios, the voltage at the output of the amplifier 202 and/or the amplifier 204 can reach Vdd. In the example of an N-type metal-oxide-semiconductor (NMOS) switch, if the source or drain voltage of a switch reaches Vdd, the gate drive voltage may be insufficient to turn the switch ON. In some examples, the resistance of the resistor 306 (e.g., R1) is selected such that a voltage drop across the resistor 306 is sufficient to lower the maximum voltage seen at the source/drain of the switches 315 to reliably turn the switches 315 ON while using NMOS switches. The NMOS switches are relatively small when compared to alternatives such as complementary metal-oxide-semiconductor (CMOS) switches, resulting in less area occupied on the chip. The resistance of the resistor 316 may be selected similarly in order to reliably turn the switches 325 ON. Although the switches 315, 325 are described in the present example as NMOS switches, other switch types may also be used such as P-type metal-oxide-semiconductor (PMOS) switches, etc.

Figure 4:
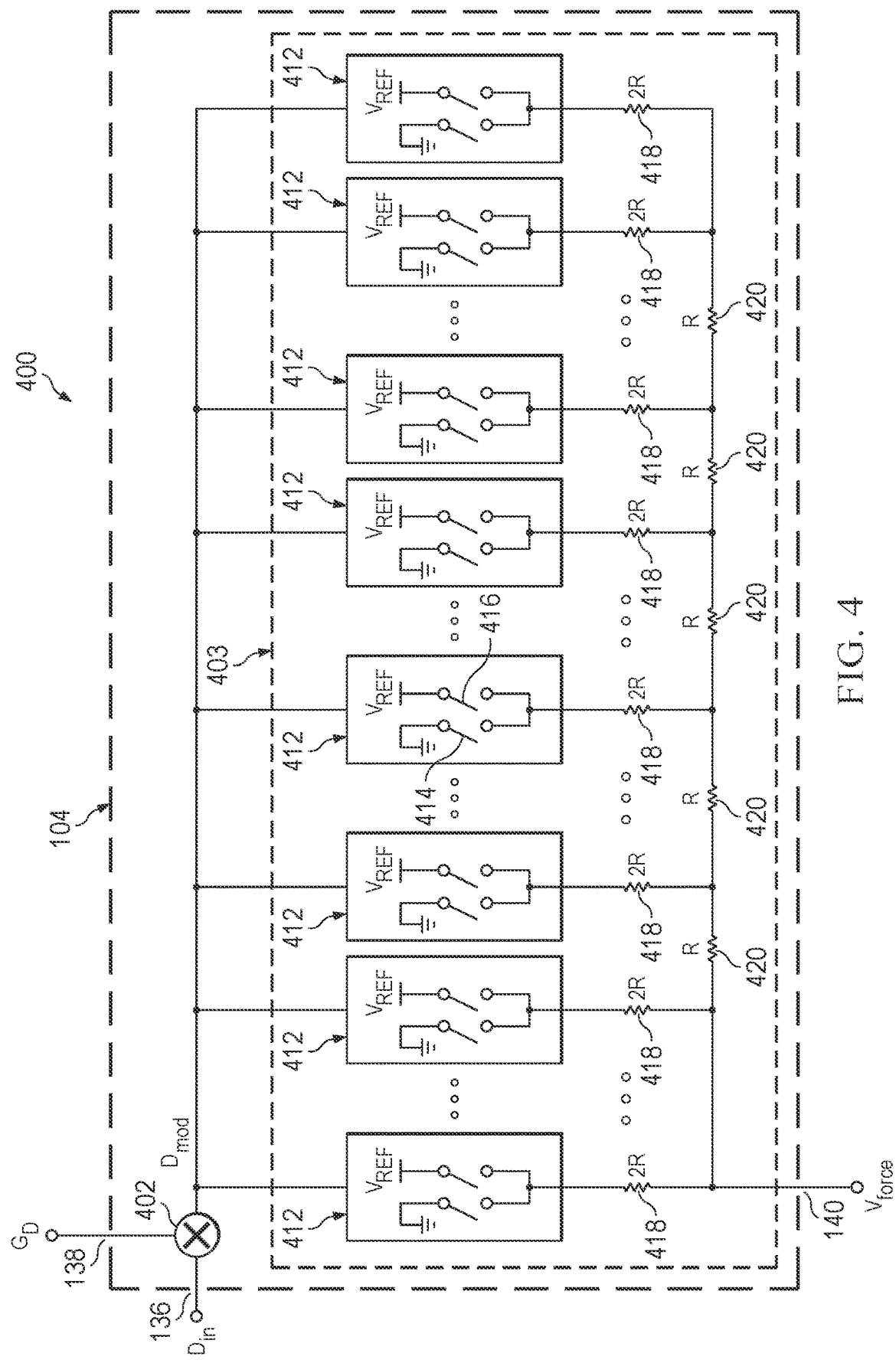
FIG. 4 is a circuit schematic illustrating an example of a digital to analog converter (DAC) having a gain selection input.

FIG. 4 illustrates an example circuit 400 including the DAC 104. Similar to FIG. 1, the DAC 104 has the first input 136, the gain selection input 138, and the output 140.

The DAC 104 includes a signal multiplier 402 having a first input coupled to the first input 136, a second input coupled to the gain selection input 138, and an output at which a signal $D_{mod}$ is provided. The DAC 104 further includes an R2R resistor ladder 403 having a plurality of inputs coupled to the output of the signal multiplier 402, and an output coupled to the output 140.

The R2R resistor ladder 403 includes a plurality of switching circuits 412, each of the plurality of switching circuits 412 having an input and an output. The inputs of the plurality of switching circuits 412 are coupled to the plurality of inputs of the R2R resistor ladder 403. Each of the plurality of switching circuits 412 includes a (first) switch 414 and a (second) switch 416. The switch 414 is coupled between the output of the switching circuit and ground. The switch 416 is coupled between the output of the switching circuit and a supply voltage terminal upon which a voltage $V_{REF}$ is received. $V_{REF}$ may be 5V, 3.3V, or another suitable voltage. The R2R resistor ladder 403 further includes a plurality of resistors 418, which are operably coupled to the outputs of the plurality of switching circuits as shown. Furthermore, a plurality of resistors 420 are operably coupled to the resistors 418 as shown. In some examples, each of the plurality of resistors 420 has a resistance of R, and each of the plurality of resistors 418 has a resistance of 2R.

In some examples, the plurality of switching circuits 412 receive the bits of the signal $D_{mod}$ on their respective inputs. Responsive to the received bit, a switching circuit closes the switch 414 or the switch 416 to provide 0V (e.g., ground) or $V_{REF}$ to the respective 2R resistor. Each bit of the signal $D_{mod}$ is weighted differently according to the R and 2R elements to produce the signal $V_{force}$ (e.g., an analog voltage). In some examples, the most significant bit (MSB) to the least significant bit (LSB) are ordered from left to right in the example of FIG. 4.

In some examples, the signal $D_{in}$ and/or the signal $G_D$ is a digital signal K bits in length, and the signal $D_{mod}$ is a digital signal K+L bits in length. The DAC 104 may be configured to multiply the signal $D_{in}$ by the signal $G_D$ using the signal multiplier 402, and perform an L bit extension on the result of the signal multiplication. In some examples, the signal $G_D$ is only used to attenuate $D_{in}$ (e.g., multiplication by a value less than 1) in order to avoid saturating the digital code. In such examples, the coarse error compensation using the current sensing amplifier 106 may be calibrated with an overrange. Subsequently, the overrange can be attenuated by the DAC 104 when performing the fine error compensation. The magnitude of the overrange may depend on the maximum error compensation the DAC 104 may need to perform.

When attenuating the signal $D_{in}$ according to the signal $G_D$, the resulting signal $D_{mod}$ may have a fractional component. By adding an L bit extension to the signal $D_{mod}$, the fractional component may be preserved during digital-to-analog conversion to the signal $V_{force}$, which reduces or eliminates differential non-linearity due to the digital error correction. In some examples, K is equal to 18, and L is equal to 3, such that $D_{in}$ and/or $G_D$ are 18 bit signals, and $D_{mod}$ is a 21 bit signal. Although the example of K=18 and L=3 is given, alternative values of K and/or L may also be used.

With reference to FIG. 5, illustrated is a table 510 and a table 520. In some examples, the tables 510 corresponds to the DAC 104 of FIG. 4 where the L bit extension is not performed. The table 520 corresponds to the DAC 104 of FIG. 4 where the L bit extension is performed. The tables 510, 520 include columns for $D_{in}$, calculated output, and Dout. $D_{in}$ may be multiplied by the signal $G_D$ by the signal multiplier 402, resulting in the calculated output. The calculated output may then be rounded in order to produce $D_{mod}$.

In the table 510, no bit extension is used. In certain scenarios with different values of $D_{in}$, the same values of $D_{mod}$ are produced as a result of rounding the calculated output, resulting in differential non-linearity. In the table 520, an L bit extension is used as described with reference to FIG. 4. As a result, a different value of $D_{mod}$ is produced for each value of $D_{in}$, and the differential non-linearity is reduced when compared to table 510.

Figure 6:
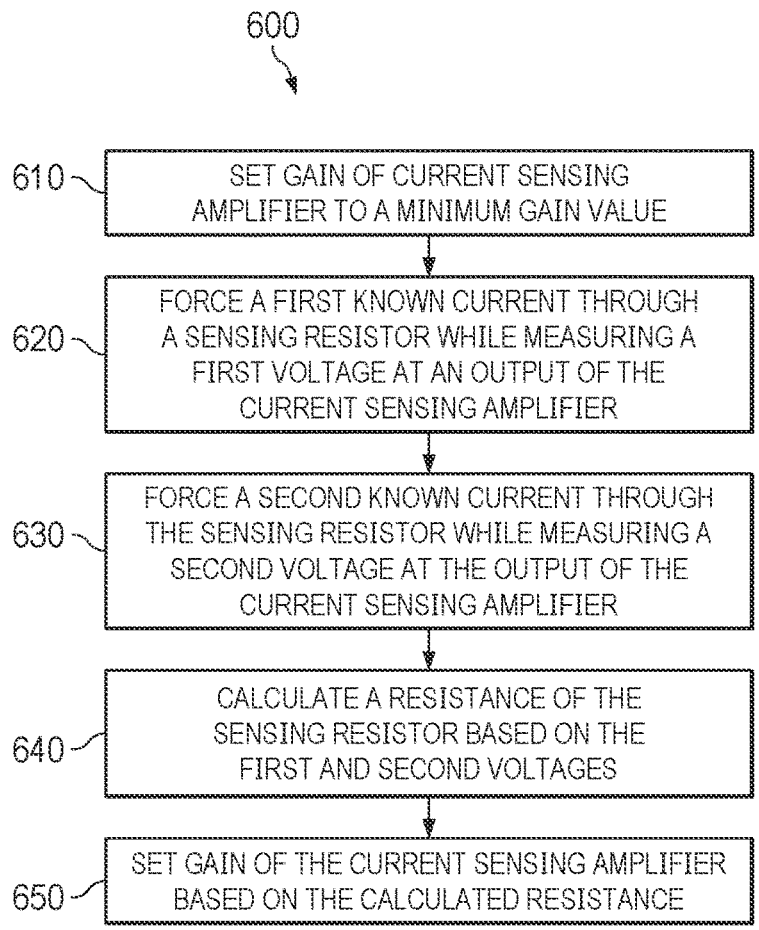
FIG. 6 is an example flow diagram for programming a gain selection circuit for a current sensing amplifier.

FIG. 6 illustrates an example process flow 600 for programming the gain selection circuit 108. Process flow 600 includes blocks 610-650, each representing functionality performed by one or more circuits or components thereof. In some examples, the process flow 600 is performed by the controller 114.

Block 610 includes setting a gain of the current sensing amplifier to a minimum gain value. In an example, the current sensing amplifier is the current sensing amplifier 106. Also, the minimum gain value is a minimum gain setting of the one or more gain settings of the current sensing amplifier 106 as described with reference to FIG. 1.

Block 620 includes forcing (providing) a first known current through a sensing resistor, and measuring a first voltage an output of the current sensing amplifier. The sensing resistor may be one of the resistors 111 described with reference to FIG. 1. For example, the sensing resistor may be the resistor associated with the active current range. Furthermore, the voltage at the output of the current sensing amplifier may be the voltage $V_{I\_meas}$, as described with reference to FIG. 1.

Block 630 includes provide a second known current through the sensing resistor, and measuring a second voltage at the output of the current sensing amplifier.

Block 640 includes calculating a resistance of the sensing resistor based on the first and second voltages. For example, the resistance is calculated using to the equation $$R_{meas} = \frac{V_2 - V_1}{I_2 - I_1} * \frac{1}{MinGain}.$$

MinGain is the minimum gain of the current sensing amplifier, $V_1$ and $V_2$ are the first and second voltages at the output of the current sensing amplifier, $I_1$ and $I_2$ are the first and second known currents, and $R_{meas}$ is the calculated resistance.

Block 650 includes setting a gain of the current sensing amplifier responsive to the calculated resistance $R_{meas}$. In some examples, the gain of the current sensing amplifier is set in order to produce an overrange, which is later attenuated out by fine error correction by the DAC 104, as previously described. For instance, he gain of the current sensing amplifier is configured according the equation $$Isense_{gain} = \frac{(1 - overrange)(Isense_{gain\_nom})R_{ideal}}{R_{meas}},$$

where $Isense_{gain\_nom}$ is the nominal gain of the current sensing amplifier, overrange is the target overrange in decimal form, $R_{ideal}$ is the ideal (e.g., "expected" or "known") resistance of the sensing resistor, and $Isense_{gain}$ is the gain of the current sensing amplifier to be configured. The gain of the current sensing amplifier may be configured from the one or more gain settings of the current sensing amplifier as previously described. In some examples, the configured gain setting is the largest gain setting from the one or more gain settings that does not exceed $Isense_{gain}$.

Configuring the gain setting of the current sensing amplifier may include programming the gain setting into an OTP (e.g., the OTP 302). The process flow 600 may be repeated using each resistor of the resistors 111 in order to program the values $G_{A[1]}, G_{A[2]}, \ldots, G_{A[M]}$ into the OTP 302 for different current ranges.

Figure 7:
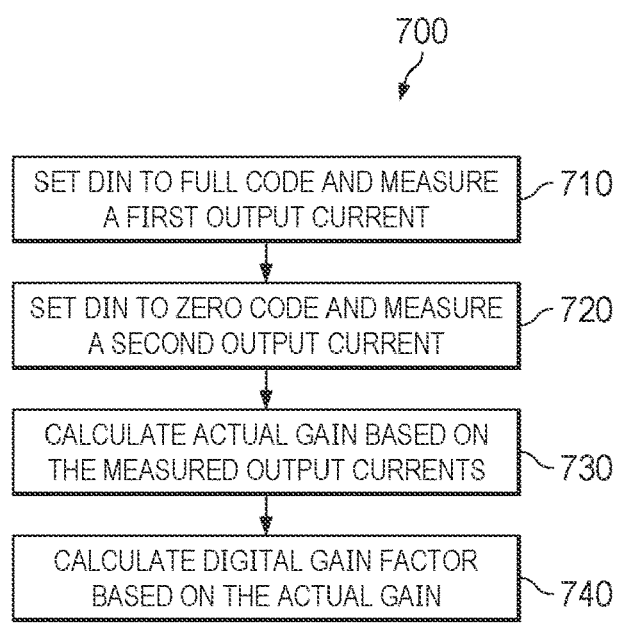

FIG. 7 illustrates an example process flow 700 for calibrating the gain of the DAC 104 using the signal $G_D$. Process flow 700 includes blocks 710-740, each representing functionality performed by one or more circuits or components thereof. In some examples, the process flow 700 is performed by the controller 114.

Block 710 includes setting $D_{in}$ to full code and measuring a first output current through the DUT 112. Setting $D_{in}$ to full code may include setting $D_{in}$ to a maximum value (e.g., a series of 1's in binary). The output current through the DUT 112 may be measured by the current sensing amplifier 106, and indicated using the signal $V_{I\_meas}$.

Block 720 includes setting $D_{in}$ to zero code and measuring a second output current through the DUT 112. Setting $D_{in}$ to zero code may include setting $D_{in}$ to a minimum value (e.g., a series of 0's in binary).

Block 730 includes calculating an actual gain based on the first and second output currents. For example, the actual gain may be calculated according to the equation $$G_{Actual} = \frac{I_1 - I_2}{FC - ZC},$$

where $I_1$ and $I_2$ are the first and second measured output currents, FC is the full code value, ZC is the zero code value, and $G_{Actual}$ is the actual gain.

Block 740 includes calculating a digital gain factor based on the actual gain. For example, the digital gain factor may be calculated using the equation $$GainFactor = \text{round}\left(\frac{G_{Ideal}}{G_{Actual}} * 2^K\right) - 1,$$

where $G_{Ideal}$ is the ideal gain, K is the length of $D_{in}$ in bits, and GainFactor is the digital gain factor. Although the example of 2K is given, in alternative examples, a different value may be used in place of K. Subsequently, the value of $G_D$ may set according to the digital gain factor. In some examples, $$D_{mod} = \frac{(GainFactor + 1) * D_{in} * 2^L}{2^K}.$$

Figure 8:
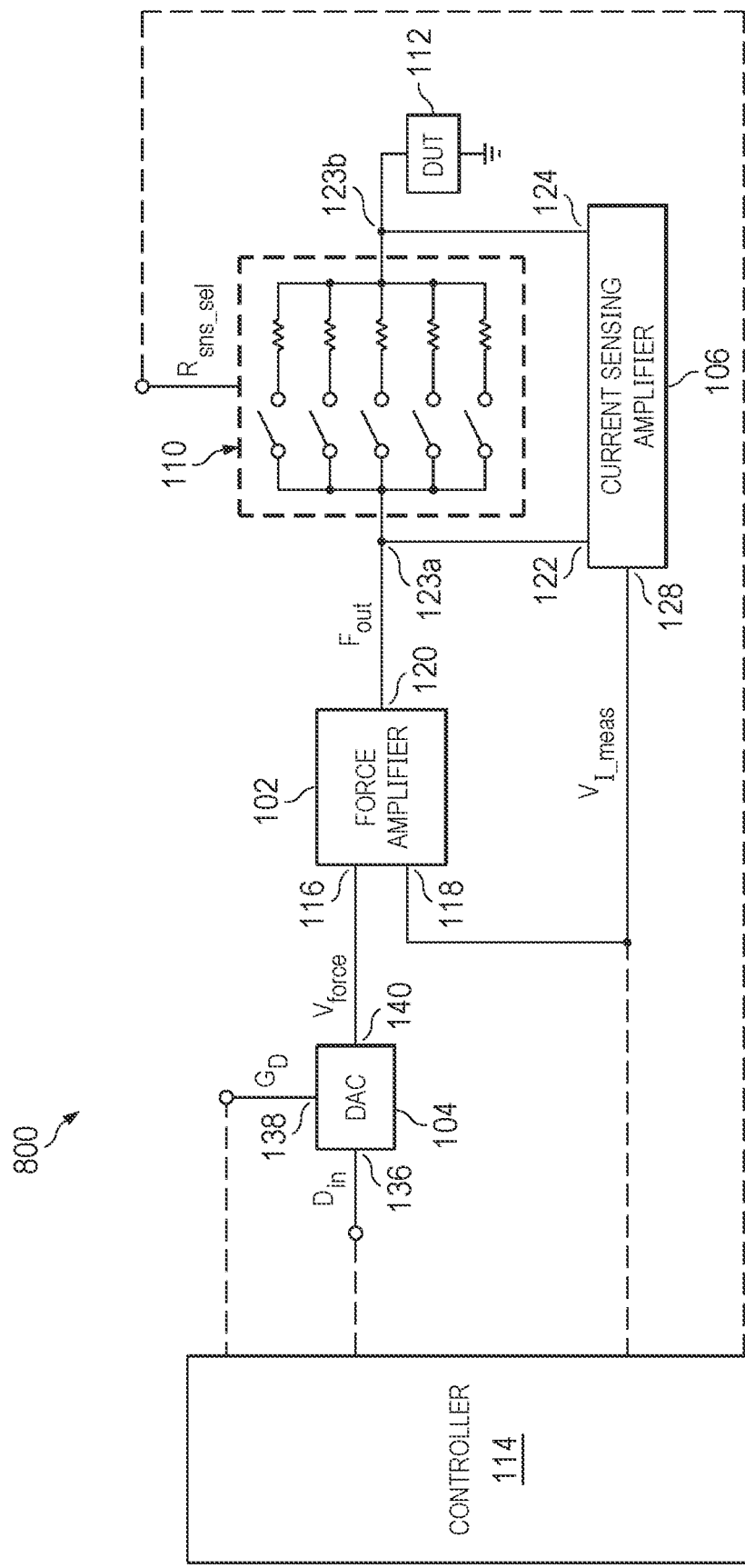
FIG. 8 is a circuit schematic illustrating an example SMU including digital gain selection circuitry.

FIG. 8 illustrates an example SMU 800 including digital gain selection circuitry. The SMU 800 includes the force amplifier 102, DAC 104, current sensing amplifier 106, resistor array 110, DUT 112, and controller 114, which may be consistent with similarly numbered elements described with reference to FIG. 1, FIG. 4, and throughout the present description. In the example of FIG. 8, the controller 114 may adjust the digital gain of the DAC 104 via the signal $G_D$ in order to perform error compensation and increase force/measure current accuracy. As described with reference to FIG. 4, the DAC 104 may perform an L bit extension after a signal multiplication of $D_{in}$ by $G_D$ in order to achieve a linear response.

Figure 9:
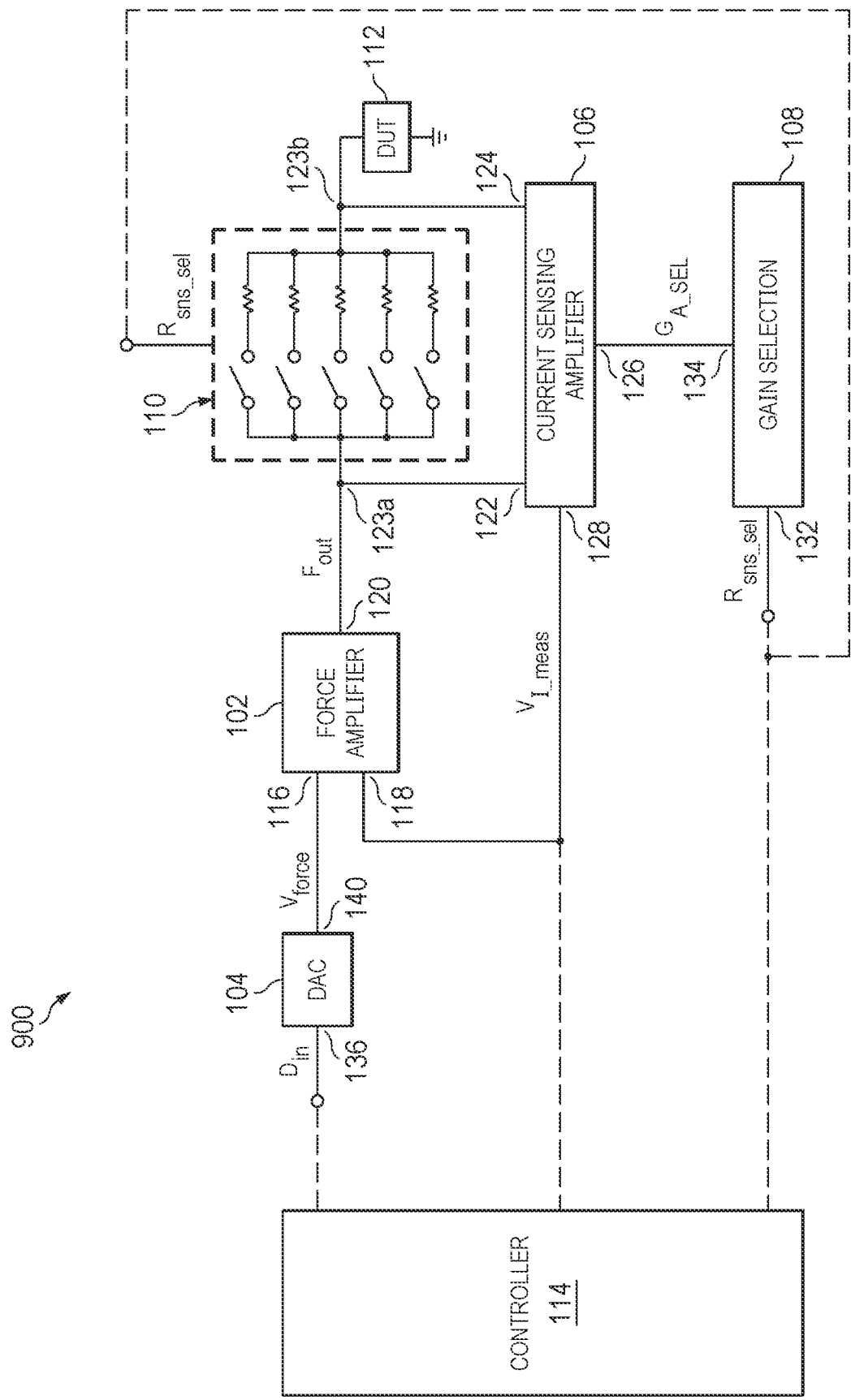
FIG. 9 is a circuit schematic illustrating an example SMU including analog gain selection circuitry.

FIG. 9 illustrates an example SMU 900 including analog gain selection circuitry. The SMU 900 includes the force amplifier 102, DAC 104, current sensing amplifier 106, gain selection circuit 108, resistor array 110, DUT 112, and controller 114, which may be consistent with similarly numbered elements described with reference to FIG. 1 and throughout the present description. In the example of FIG. 9, the gain of the current sensing amplifier 106 may be adjusted via the signal $G_{A\_SEL}$ in order to perform error compensation and increase force/measure current accuracy.

Figure 10:
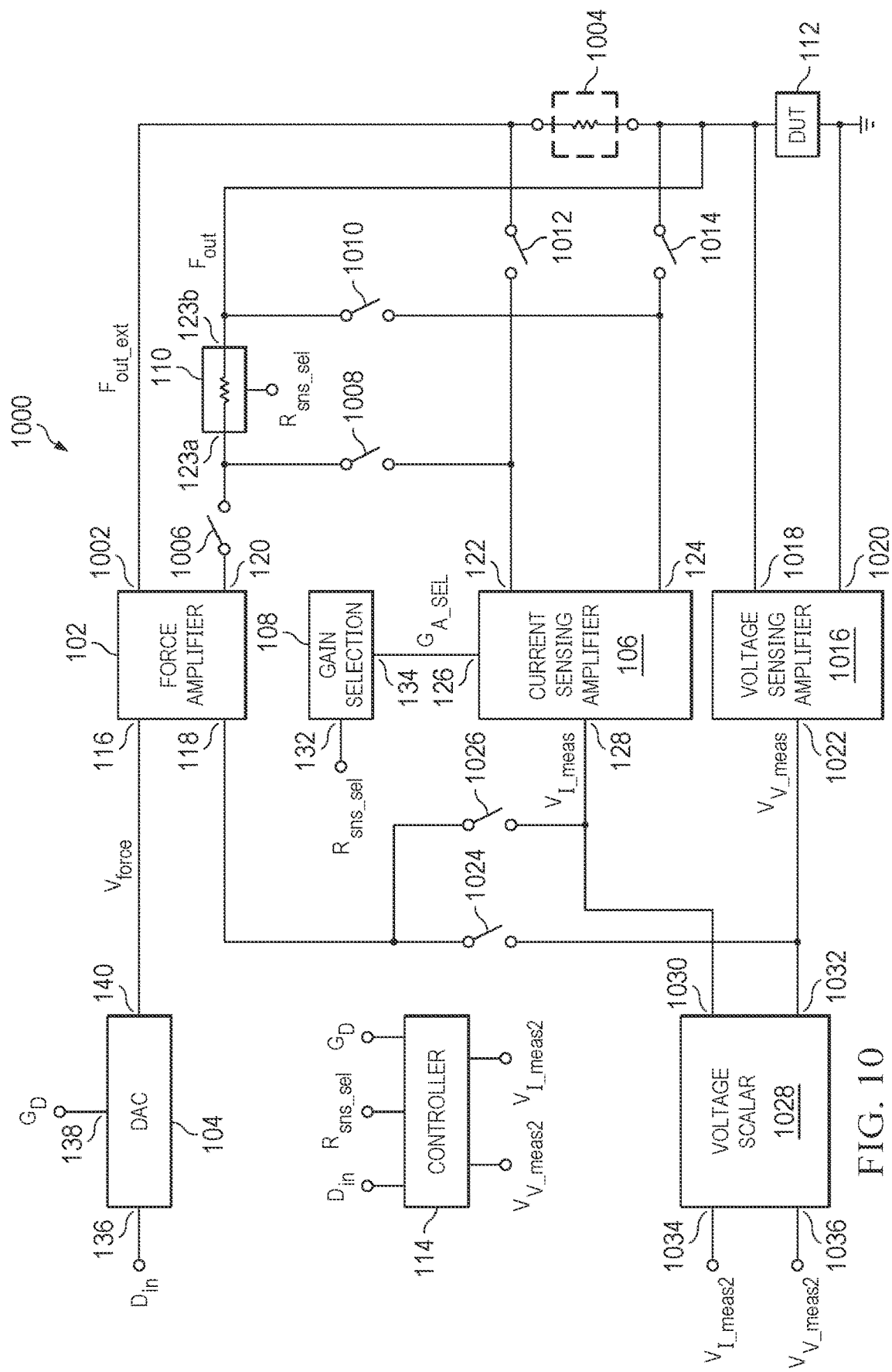
FIG. 10 is a circuit schematic illustrating an example.

FIG. 10 illustrates an example of an SMU 1000. The SMU 1000 includes the force amplifier 102, DAC 104, current sensing amplifier 106, gain selection circuit 108, resistor array 110, DUT 112, and controller 114, which may be consistent with similarly numbered elements described with reference to FIG. 1 and throughout the present description. As shown, the SMU 1000 further includes a voltage sensing amplifier 1016, a voltage scalar circuit 1028, and switches 1006, 1008, 1010, 1012, 1014, 1024, and 1026. In some examples, the voltage sensing amplifier 1016 is used by the SMU 1000 to measure a voltage across the DUT 112 to determine IV characteristics of the DUT 112.

In the example of FIG. 10, the force amplifier 102 further has a (second) output 1002. A resistor 1004 has a first terminal coupled to the output 1002 and a second terminal coupled to the DUT 112, as shown. In some examples, the resistor 1004 is external to the SMU 1000, and coupled to the SMU 1000 via terminals or pins. The force amplifier may utilize the output 120 or the output 1002 to source current or voltage to the DUT 112. For example, the resistors 111 in the resistor array 110 may utilized with one or more pre-defined current ranges. Since the resistor 1004 is external to the SMU 1000, the resistor 1004 may be changed flexibly in order to accommodate additional current ranges.

The SMU 1000 further includes the voltage sensing amplifier 1016 and the voltage scalar circuit 1028. The voltage sensing amplifier has a (first) input 1018 and a (second) input 1020 coupled to first and second terminals of the DUT 112 respectively. The voltage sensing amplifier further has an output 1022 at which a signal $V_{V\_meas}$ is provided. The voltage sensing amplifier 1016 may be used to measure voltage across the DUT 112, which may be indicated using the signal $V_{V\_meas}$. The signal $V_{V\_meas}$ may indicate voltage measurements to the controller 114 in the measure voltage mode, or be used as feedback to the input 118 of the force amplifier 102 in the force voltage mode. The voltage scalar circuit 1028 has a (first) input 1030 coupled to the current sensing amplifier 106, a (second) input 1032 coupled to the voltage sensing amplifier 106, and a (first) output 1034 and a (second) output 1036 coupled to the controller 114. The voltage scalar circuit 1028 may perform voltage downscaling on $V_{I\_meas}$ and/or $V_{V\_meas}$ and provide the scaled down voltages as $V_{I\_meas2}$ and $V_{V\_meas2}$ respectively to the controller 114.

The SMU 1000 further includes the switches 1006, 1008, 1010, 1012, 1014, 1024, and 1026. The switches 1006, 1008, 1010, 1012, 1014, 1024, and/or 1026 may have control terminals that are coupled to the controller 114, which may open/close the switches according to the functionality described herein.

The switch 1006 has a first terminal coupled to the output 120, and a second terminal coupled to the terminal 123a. The switch 1006 may be opened/closed in order to switch between utilizing the output 120 and the output 1002 of the force amplifier 102.

The switch 1008 has a first terminal coupled to the terminal 123a, and a second terminal coupled to the input 122 of the current sensing amplifier 106. The switch 1010 has a first terminal coupled to the terminal 123b, and a second terminal coupled to the input 124 of the current sensing amplifier 106. The switches 1008, 1010 may be closed when measuring current while the output 120 of the force amplifier 102 is in use, and open otherwise.

The switch 1012 has a first terminal coupled to the first terminal of the resistor 1004, and a second terminal coupled to the input 122 of the current sensing amplifier 106. The switch 1014 has a first terminal coupled to the second terminal of the resistor 1004, and a second terminal coupled to the input 124 of the current sensing amplifier 106, The switches 1012, 1014 may be closed when measuring current while the output 1002 is in use, and open otherwise.

The switch 1024 has a first terminal coupled to the output 1022 of the voltage sensing amplifier 1016, and a second terminal coupled to the input 118 of the force amplifier 102. The switch 1026 has a first terminal coupled to the output 128 of the current sensing amplifier 106, and a second terminal coupled to the input 118 of the force amplifier 102. In the force voltage mode, the switch 1024 may be closed and the switch 1026 may be open in order to provide feedback to the force amplifier 102 responsive to the voltage across the DUT 112. In the force current mode, the switch 1024 may be open and the switch 1026 may be closed in order to provide feedback to the force amplifier 102 responsive to the current through the DUT 112.

Figure 11:
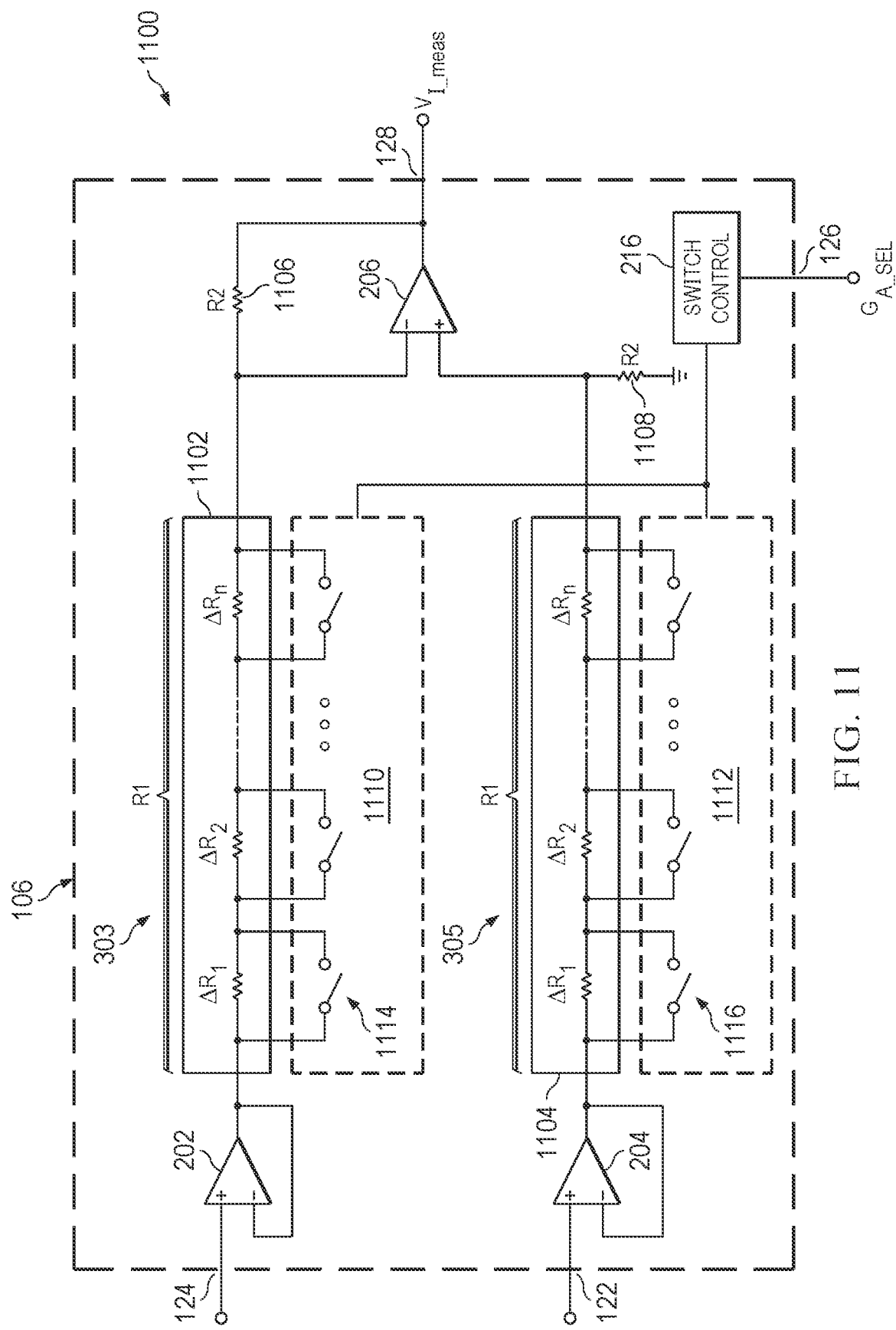
FIGS. 11-13 illustrate various examples of a variable gain current sensing amplifier.
Figure 12:
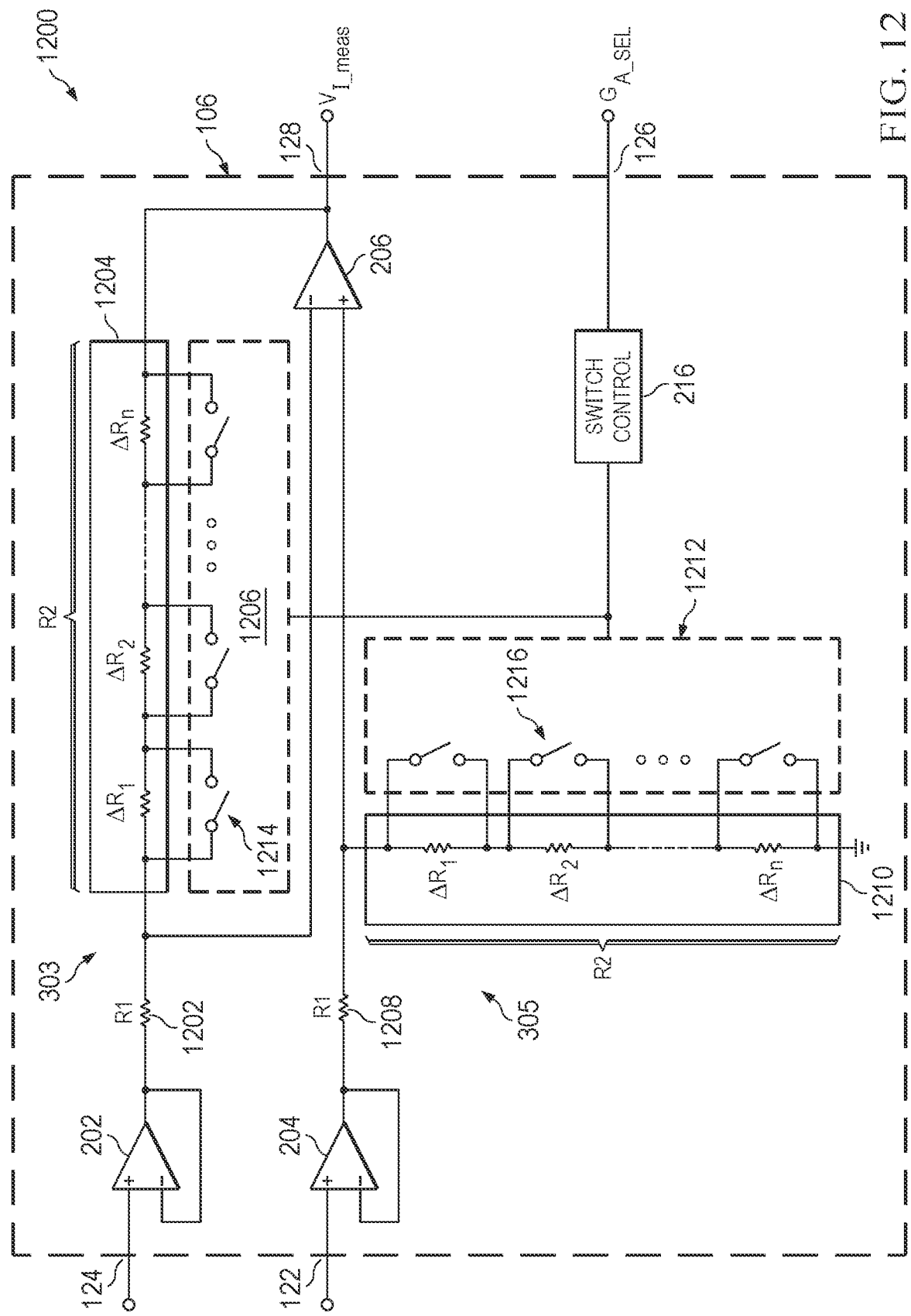
Figure 13:
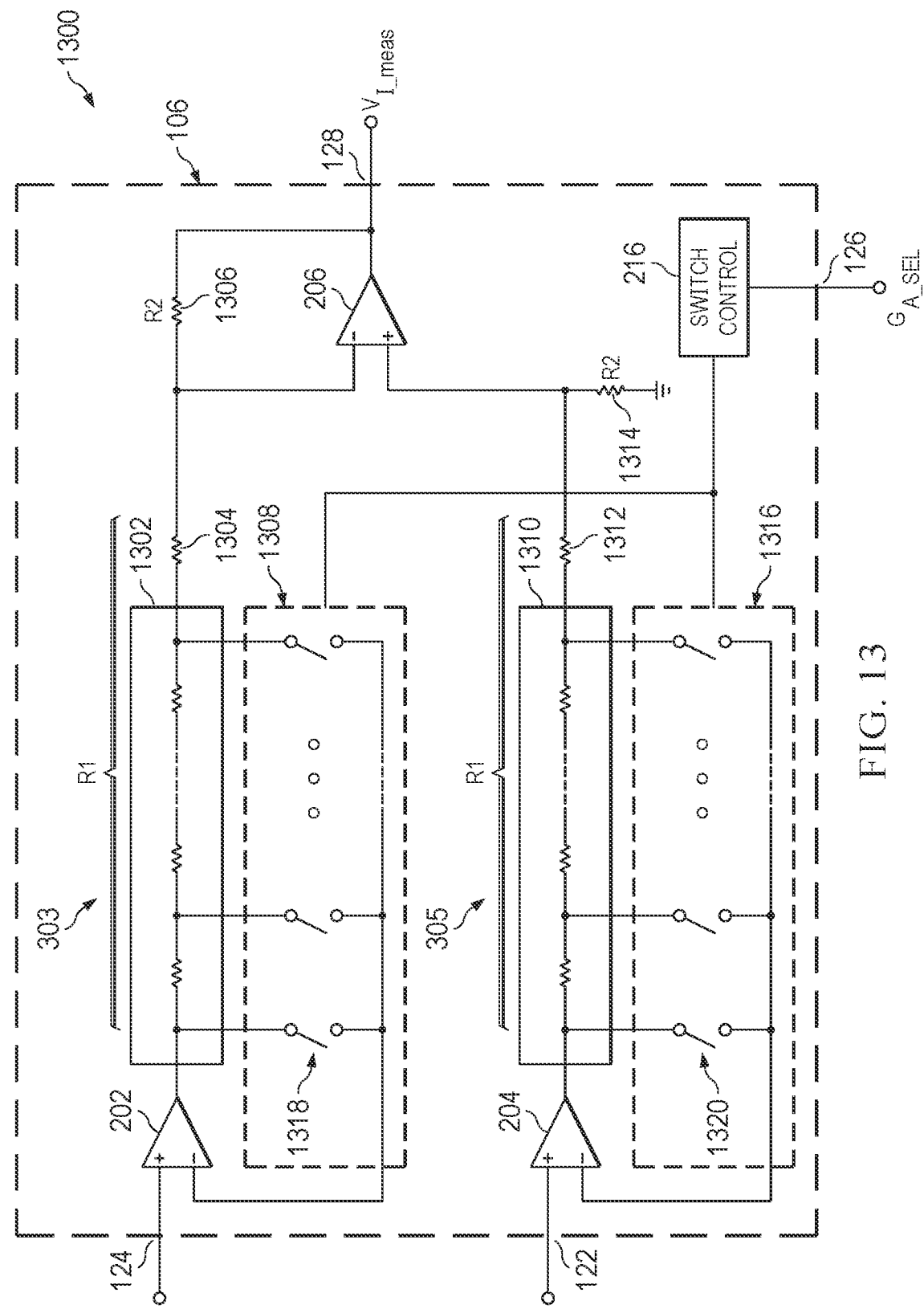

FIGS. 11-13 illustrates example circuits 1100, 1200, 1300 including a current sensing amplifier 106. Similar to FIG. 2, the current sensing amplifier 106 includes the amplifiers 202, 204, 206, and the switch control circuit 216, which are operably coupled as shown. Further, the plurality of resistors 303 are coupled in series between the output of the amplifier 202 and the output of the amplifier 206, and the plurality of resistors 305 are coupled in series between the output of the amplifier 204 and ground.

With reference to FIG. 11, the plurality of resistors 303 includes a plurality of resistors 1102, and a (first) resistor 1106. The plurality of resistors 305 includes a plurality of resistors 1104 and a (second) resistor 1108. The plurality of resistors 1102 are coupled in series between the output of the amplifier 102 and the second input of the amplifier 206, and the plurality of resistors 1104 are coupled in series between the output of the amplifier 204 and the first input of the amplifier 206. The resistor 1106 has a first terminal coupled to the second input of the amplifier 206, and a second terminal coupled to the output of the amplifier 206. The resistor 1108 has a first terminal coupled to the first input of the amplifier 206, and a second terminal coupled to ground. A collective resistance of the plurality of resistors 1102 and a collective resistance of the plurality of resistors 1104 may be referred to as R1. Furthermore, the resistor 1106 and the resistor 1108 each have a resistance referred to as R2.

The current sensing amplifier 106 further includes a (first) switching network 1110 and a (second) switching network 1112. The switching network 1110 includes a plurality of switches 1114 coupled to the plurality of resistors 1102 as shown. In some examples, one or more of the switches 1114 are closed by the switch control circuit 216 (e.g., responsive to the signal $G_{A\_SEL}$) in order to bypass one or more resistors of the plurality of resistors 1102 and adjust the value of R1. By closing one or more of the switches 1114, the value of R1 can be reduced, which adjusts the gain of the current sensing amplifier 106 by adjusting the ratio of R2/R1. A plurality of switches 1116 of the switching network 1112 may be controlled in a similar manner to adjust the value of R1 in the lower branch of the circuit.

With reference to FIG. 12, the plurality of resistors 303 includes a (first) resistor 1202 and a plurality of resistors 1204. The plurality of resistors 305 includes a (second) resistor 1208 and a plurality of resistors 1210. The resistor 1202 has a first terminal coupled to the output of the amplifier 202 and a second terminal coupled to the second input of the amplifier 206. The resistor 1208 has a first terminal coupled to the output of the amplifier 204, and a second terminal coupled to the first input of the amplifier 206. The plurality of resistors 1204 are coupled in series between the second input of the amplifier 206 and the output of the amplifier 206. The plurality of resistors 1210 are coupled in series between the first input of the amplifier 206 and ground. The resistor 1202 and the resistor 1208 each have a resistance referred to as R1. Furthermore, a collective resistance of the plurality of resistors 1204 and a collective resistance of the resistors 1210 may be referred to as R2.

The current sensing amplifier 106 further includes a (first) switching network 1206 and a (second) switching network 1212. The switching network 1206 includes a plurality of switches 1214 coupled to the plurality of resistors 1204 as shown. In some examples, one or more of the switches 1214 are closed by the switching control circuit 216 (e.g., responsive to the signal $G_{A\_SEL}$) in order to bypass one or more resistors of the plurality of resistors 1204 and adjust the value of R2. By closing one or more of the switches 1214, the value of R2 can be reduced, which adjusts the gain of the current sensing amplifier 106 by adjusting the ratio of R2/R1. A plurality of switches 1216 of the switching network 1212 may be controlled in a similar manner to adjust the value of R2 in the lower branch of the circuit.

With reference to FIG. 13, the plurality of resistors 303 includes a plurality of resistors 1302, a (first) resistor 1304, and a (second) resistor 1306. The plurality of resistors 1302 are coupled in series between the output of the amplifier 202 and a first terminal of the resistor 1304. A second terminal of the resistor 1304 is coupled to the second input of the amplifier 206. The resistor 1306 has a first terminal coupled to the second input of the amplifier 206, and a second terminal coupled to the output of the amplifier 206. The plurality of resistors 305 includes a plurality of resistors 1310, a (third) resistor 1312, and a (fourth) resistor 1314. The plurality of resistors 1310 are coupled in series between the output of the amplifier 204 and a first terminal of the resistor 1312. A second terminal of the resistor 1312 is coupled to the first input of the amplifier 206. The resistor 1314 has a first terminal coupled to the first input of the amplifier 206, and a second terminal coupled to ground. A collective resistance of the plurality of resistors 1302 and the resistor 1304 may be referred to as R1. Further, a collective resistance of the plurality of resistors 1310 and the resistor 1312 may be referred to as R1. The resistor 1306 and the resistor 1314 each have a resistance referred to as R2.

The current sensing amplifier 106 further includes a (first) switching network 1308 and a (second) switching network 1316. The switching network 1308 includes a plurality of switches 1318 coupled to the plurality of resistors 1302 as shown. In some examples, a single switch of the plurality of switches 1318 is closed by the switch control circuit 216 (e.g., responsive to the signal $G_{A\_SEL}$), and the remaining switches of the plurality of switches 1318 are opened. By closing the single switch, the value of R1 can be reduced, which adjusts the gain of the current sensing amplifier 106 by adjusting the ratio of R2/R1. A plurality of switches 1320 of the switching network 1316 may be controlled in a similar manner to adjust the value of R1 in the lower branch of the circuit.

The methods are illustrated and described above as a series of operations or events, but the illustrated ordering of such operations or events is not limiting. For example, some operations or events may occur in different orders and/or concurrently with other operations or events apart from those illustrated and/or described herein. Also, some illustrated operations or events are optional to implement one or more aspects or examples of this description. Further, one or more of the operations or events depicted herein may be performed in one or more separate operations and/or phases. In some examples, the methods described above may be implemented in a computer readable medium using instructions stored in a memory.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

In this description, the term "couple" may cover connections, communications or signal paths that enable a functional relationship consistent with this description. For example, if device A generates a signal to control device B to perform an action, then: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors are described herein, other transistors (or equivalent devices) may be used instead with little or no change to the remaining circuitry. For example, a field effect transistor, a bipolar junction transistor (BJT—e.g. NPN or PNP), insulated gate bipolar transistors (IGBTs), and/or junction field effect transistor (JFET) may be used in place of or in conjunction with the devices described herein. The transistors may be depletion mode devices, drain-extended devices, enhancement mode devices, natural transistors or other type of device structure transistors. Furthermore, the devices may be implemented in/over a silicon substrate (Si), a silicon carbide substrate (SiC), a gallium nitride substrate (GaN) or a gallium arsenide substrate (GaAs).

While certain elements of the described examples are included in an integrated circuit and other elements are external to the integrated circuit, in other examples, additional or fewer features may be incorporated into the integrated circuit. Also, some or all of the features illustrated as being external to the integrated circuit may be included in the integrated circuit and/or some features illustrated as being internal to the integrated circuit may be incorporated outside of the integrated circuit. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means+/−10 percent of that parameter. Modifications are possible in the described examples, and other implementations are possible, within the scope of the claims.

What is claimed is:

1. A circuit, comprising:
   a force amplifier having a first input, a second input, and an output;
   a resistor array having a first terminal coupled to the output of the force amplifier, a second terminal, and a control terminal;
   a digital to analog converter (DAC) having a first input, an output coupled to the first input of the force amplifier, and a gain selection input;
   a current sensing amplifier having a first input coupled to the first terminal of the resistor array, a second input coupled to the second terminal of the resistor array, an output coupled to the second input of the force amplifier, and a gain selection input; and
   a gain selection circuit having a control terminal coupled to the control terminal of the resistor array, and an output coupled to the gain selection input of the current sensing amplifier.

2. The circuit of claim 1, wherein the gain selection circuit includes a multiplexer having a plurality of inputs, an output coupled to the output of the gain selection circuit, and a selection input coupled to the control terminal of the gain selection circuit.

3. The circuit of claim 2, wherein the gain selection circuit further includes a one-time programmable memory having a plurality of outputs coupled to the plurality of inputs of the multiplexer respectively.

4. The circuit of claim 2, wherein the gain selection circuit is configured to output a multi-bit gain selection signal.

5. The circuit of claim 1, wherein the DAC further includes a signal multiplier having a first input coupled to the first input of the DAC, a second input coupled to the gain selection input of the DAC, and an output;
   wherein the signal multiplier is configured to receive a signal of K bits in length on the first input of the signal multiplier; and
   wherein the signal multiplier is configured to provide a signal of K+L bits in length at the output of the signal multiplier.

6. The circuit of claim 5, wherein the DAC further includes an R2R resistor ladder having at least K+L number of inputs coupled to the output of the signal multiplier, and an output coupled to the output of the DAC.

7. A circuit, comprising:
   a force amplifier having a first input, a second input, and an output;
   a resistor array having a first terminal coupled to the output of the force amplifier, a second terminal, and a control terminal;
   a current sensing amplifier having a first input coupled to the first terminal of the resistor array, a input coupled to the second terminal of the resistor array, an output coupled to the input of the force amplifier, and a gain selection input; and
   a gain selection circuit having a control terminal coupled to the control terminal of the resistor array, and an output coupled to the gain selection input of the current sensing amplifier.

8. The circuit of claim 7, wherein the current sensing amplifier includes:
   a first amplifier having a first input coupled to the first input of the current sensing amplifier, a second input, and an output coupled to the second input;
   a second amplifier having a first input coupled to the input of the current sensing amplifier, a second input, and an output coupled to the second input;
   a third amplifier having a first input, a second input, and an output coupled to the output of the current sensing amplifier;
   a first plurality of resistors coupled in series between the output of the first amplifier and the output of the third amplifier;
   a second plurality of resistors coupled in series between the output of the second amplifier and ground;
   a first switching network having a plurality of inputs coupled to the first plurality of resistors, and a control input; and
   a second switching network having a plurality of inputs coupled to the second plurality of resistors, and a control input.

9. The circuit of claim 8, wherein an output of the first switching network is coupled to the second input of the third amplifier; and
   wherein the first switching network includes a plurality of switches respectively having a plurality of first terminals and a plurality of second terminals, the plurality of first terminals coupled to the plurality of inputs of the first switching network respectively, and the plurality of second terminals coupled to the output of the first switching network.

10. The circuit of claim 9, wherein an output of the second switching network is coupled to the first input of the third amplifier; and
   wherein the second switching network includes a plurality of switches respectively having a plurality of first terminals and a plurality of second terminals, the plurality of first terminals coupled to the plurality of inputs of the second switching network respectively, and the plurality of second terminals coupled to the output of the second switching network.

11. The circuit of claim 8, wherein the first switching network comprises a plurality of switches, wherein each switch of the plurality of switches is coupled in parallel with a resistor of the first plurality of resistors.

12. The circuit of claim 8, wherein the output of the first amplifier is coupled to the second input of the first amplifier via the first switching network, the first switching network having an output coupled to the second input of the first amplifier; and
    wherein the first switching network includes a plurality of switches respectively having a plurality of first terminals and a plurality of second terminals, the plurality of first terminals coupled to the plurality of inputs of the first switching network respectively, and the plurality of second terminals coupled to the output of the first switching network.

13. The circuit of claim 8, wherein the current sensing amplifier further includes a switch control circuit having a control input coupled to the gain selection input of the current sensing amplifier, a first output coupled to the control input of the first switching network, and a second output coupled to the control input of the second switching network.

14. The circuit of claim 7, further comprising: a digital to analog converter (DAC) having a first input, an output coupled to the first input of the force amplifier, and a gain selection input.

15. A circuit, comprising:
    a force amplifier having a first input, a second input, and an output;
    a sensing resistor having a first terminal coupled to the output of the force amplifier, and a second terminal;
    a digital to analog converter (DAC) having a first input, a gain selection input, and an output coupled to the first input of the force amplifier; and
    a current sensing amplifier having a first input coupled to the first terminal of the sensing resistor, a second input coupled to the second terminal of the sensing resistor, an output coupled to the second input of the force amplifier, and a gain selection input;
    wherein the current sensing amplifier is configured to adjust a gain of the current sensing amplifier responsive to a first gain selection signal received on the gain selection input of the current sensing amplifier; and
    wherein the DAC is configured to adjust a gain of the DAC responsive to a second gain selection signal received on the gain selection input of the DAC.

16. The circuit of claim 15, wherein adjusting the gain of the DAC includes multiplying a first signal received on the first input by a second signal received on the second input, wherein the first and second signals are K bits in length, and wherein a result of the multiplication is K+L bits in length.

17. The circuit of claim 16, wherein K is equal to 18, and wherein L is equal to 3.

18. The circuit of claim 15, wherein the sensing resistor is part of a sensing resistor array, and wherein the sensing resistor array is configured to select the sensing resistor from a plurality of sensing resistors responsive to a resistor selection signal.

19. The circuit of claim 18, further comprising a gain selection circuit configured to provide the first gain selection signal to the current sensing amplifier responsive to the resistor selection signal.

20. The circuit of claim 15, wherein the current sensing amplifier is configured to adjust the gain of the current sensing amplifier by using a switching network to adjust one or more feedback resistance values.

* * * * *